United States Patent
Huang et al.

(10) Patent No.: US 8,377,733 B2
(45) Date of Patent: Feb. 19, 2013

(54) ANTIREFLECTIVE LAYER FOR BACKSIDE ILLUMINATED IMAGE SENSOR AND METHOD OF MANUFACTURING SAME

(75) Inventors: Chih-Hui Huang, Yongkang (TW); Cheng-Yuan Tsai, Chu-Pei (TW); Yeur-Luen Tu, Taichung (TW); Chia-Shiung Tsai, Hsin-Chu (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 12/890,913

(22) Filed: Sep. 27, 2010

(65) Prior Publication Data

US 2012/0038015 A1    Feb. 16, 2012

Related U.S. Application Data

(60) Provisional application No. 61/373,500, filed on Aug. 13, 2010.

(51) Int. Cl.
*H01L 21/00* (2006.01)

(52) U.S. Cl. ............ 438/72; 438/69; 257/184; 257/437; 257/E31.001

(58) Field of Classification Search ............ 257/228, 257/184
See application file for complete search history.

(56) References Cited

U.S. PATENT DOCUMENTS

| 7,332,751 | B2 * | 2/2008 | Iguchi | 257/184 |
|---|---|---|---|---|
| 8,053,856 | B1 * | 11/2011 | Tu et al. | 257/432 |
| 2007/0001100 | A1 | 1/2007 | Hsu et al. | |
| 2007/0048965 | A1 | 3/2007 | Hsieh et al. | |
| 2007/0262364 | A1 | 11/2007 | Hsu et al. | |
| 2008/0290441 | A1 | 11/2008 | Hsu et al. | |

OTHER PUBLICATIONS

Madelung O., and U. Rossler and M. Schulz. Landolt-Bornstein Numerical Data and Functional Relationships in Science and Technology New Series, Group III: Condensed Matter, vol. 41, Semiconductors, Springer, 2002.*

* cited by examiner

*Primary Examiner* — Julio J Maldonado
*Assistant Examiner* — Sonya D McCall Shepard
(74) *Attorney, Agent, or Firm* — Haynes and Boone, LLP

(57) ABSTRACT

The present disclosure provides an image sensor device that exhibits improved quantum efficiency. For example, a backside illuminated (BSI) image sensor device is provided that includes a substrate having a front surface and a back surface; a light sensing region disposed at the front surface of the substrate; and an antireflective layer disposed over the back surface of the substrate. The antireflective layer has an index of refraction greater than or equal to about 2.2 and an extinction coefficient less than or equal to about 0.05 when measured at a wavelength less than 700 nm.

20 Claims, 9 Drawing Sheets

ANTIREFLECTIVE LAYER FOR BACKSIDE ILLUMINATED IMAGE SENSOR AND METHOD OF MANUFACTURING SAME

This application claims priority to U.S. Provisional Patent Application Ser. No. 61/373,500 filed on Aug. 13, 2010, the entire disclosure of which is incorporated herein by reference.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. In general, BSI technology provides higher sensitivity, lower cross-talk, and comparable quantum efficiency as compared to FSI image sensor devices.

Due to device scaling, improvements to BSI technology are continually being made to further improve the BSI image sensor device's quantum efficiency. For example, an antireflective coating (ARC) layer is disposed over the backside surface of the substrate to improve transmittance of light wavelengths to the substrate, and thus, to the pixel grid for sensing light. Typical ARC layers include silicon oxynitride (SiON) and/or silicon nitride (SiN) (such as a ultraviolet silicon nitride (UVSN) layer) layers. As technology nodes continue to decrease, for example, to 65 nm technology nodes and below, these typical ARC layers are intrinsically limited to the quantum efficiency improvements they can provide. Accordingly, although existing BSI image sensor devices and methods of fabricating these BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
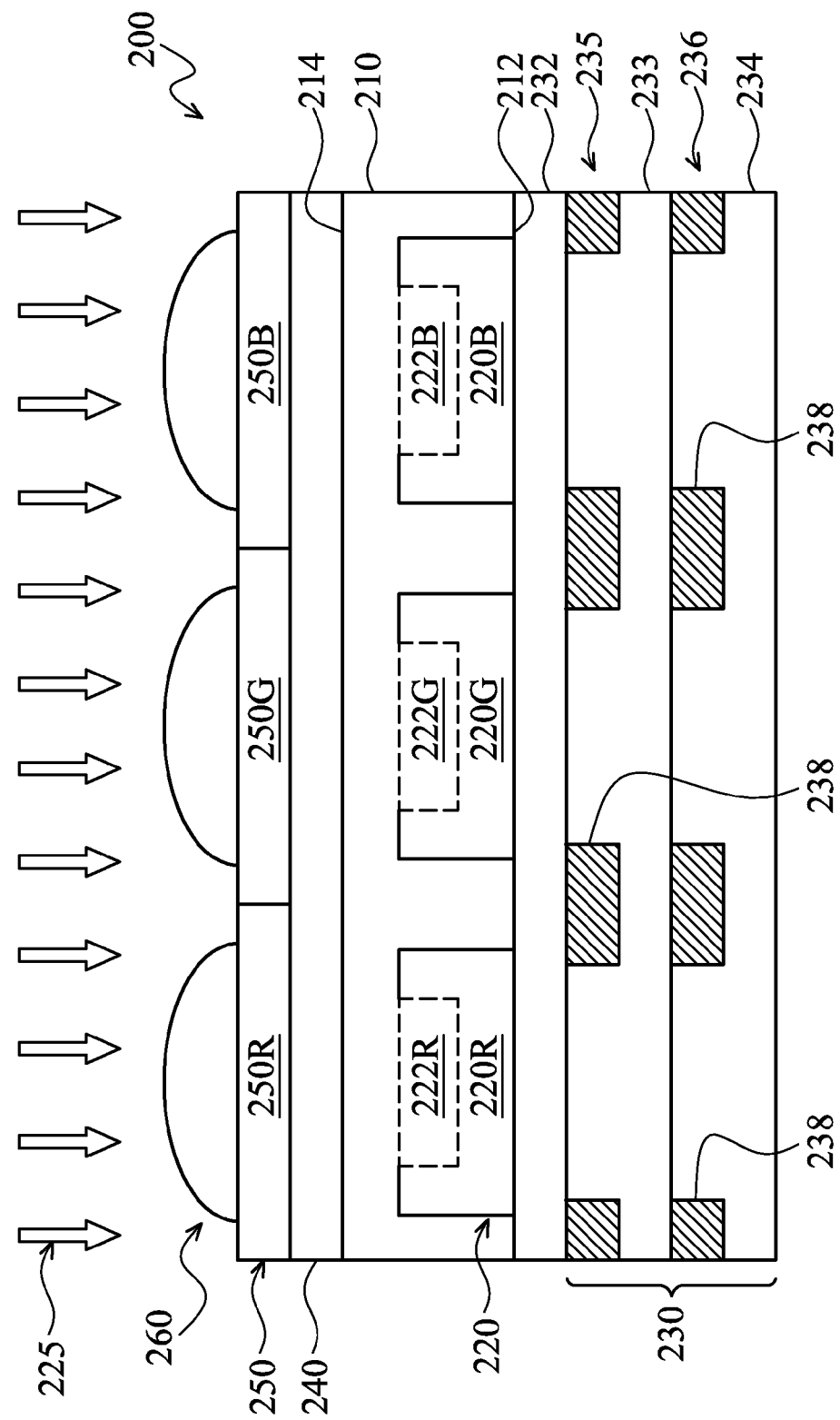
FIG. 1 is a diagrammatic sectional side view of an integrated circuit device according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic sectional side view of an embodiment of an integrated circuit device 200 according to various aspects of the present disclosure. In the depicted embodiment, integrated circuit device 200 is a backside illuminated (BSI) image sensor device. The BSI image sensor device 200 may include additional features not described herein. For example, the integrated circuit device 200 may be an integrated circuit (IC) chip, system on chip (SoC), or portion thereof, that includes various passive and active microelectronic devices such as resistors, capacitors, inductors, diodes, metal-oxide-semiconductor field effect transistors (MOSFET), complementary metal-oxide-semiconductor (CMOS) transistors, high voltage transistors, high frequency transistors, other suitable components, or combinations thereof. In the depicted embodiment, FIG. 1 has been simplified for the sake of clarity to better understand the inventive concepts of the present disclosure. Additional features can be added in the integrated circuit device 200, and some of the features described below can be replaced or eliminated for other embodiments of the integrated circuit device 200.

The BSI image sensor device 200 includes a substrate 210 having a front surface 212 and a back surface 214. In the depicted embodiment, the substrate 210 is a semiconductor substrate including silicon. Alternatively or additionally, the substrate 210 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate may be a p-type or an n-type substrate depending on design requirements of the integrated circuit device 200. The substrate 210 may be a semiconductor on insulator (SOI). The substrate 210 may include a doped epi layer, a gradient semiconductor layer, and/or a semiconductor layer overlying another semiconductor layer of a different type, such as a silicon layer on a silicon germanium layer. The substrate 210 may include various doped regions, doped with n-type dopants and/or p-type dopants, depending on design requirements of the BSI image sensor device 200. The substrate 210 may also include isolation features (not shown), such as shallow trench isolation (STI) and/or local oxidation of silicon (LOCOS) features, to separate the pixels (discussed below) and/or other devices formed on the substrate 210.

The BSI image sensor device 200 includes a pixel array (or grid) 220 formed at the front surface 212 of the substrate 210. The pixel array 220 detects an intensity (brightness) of radiation, such as incident radiation (light) 225, directed toward the back surface 214 of the substrate 210. In the depicted embodiment, the incident radiation 225 is visual light. Alternatively, the radiation 225 could be infrared (IR), ultraviolet (UV), X-ray, microwave, other suitable radiation type, or combinations thereof. The pixel array 220 includes pixels 220R, 220G, and 220B that correspond with specific light wavelengths, such as red, green, and blue light wavelengths, respectively. In other words, the pixels 220R, 220G, and 220B each detect an intensity (brightness) of a respective light wavelength. The pixel array 220 may alternatively or additionally include pixels that correspond with different light wavelengths. The term "pixel" refers to a unit cell containing features (for example, circuitry including a photodetector and various semiconductor devices) for converting electromagnetic radiation to an electrical signal. The pixels 220R, 220G, and 220B include various features and circuitry allowing the pixels to detect intensity of the respective light wavelengths. For example, in the depicted embodiment, the pixels 220R, 220G, and 220B are photodetectors, such as photodiodes, that include a light-sensing region 222R, 222G, and 222B, respectively. The light-sensing regions 222R, 222G, and 222B may be a doped region having n-type and/or p-type dopants formed in the substrate 210 by an ion implantation process, diffusion process, or other suitable process. The pixels 220R, 220G, and/or 220B could additionally or alternatively include a complimentary metal-oxide-semiconductor (CMOS) image sensor (CIS), a charge coupling device (CCD) image sensor, an active pixel (ACP) image sensor, a passive pixel image sensor, other suitable image sensor, or combinations thereof. The pixels 220R, 220G, and/or 220B could also additionally or alternatively include various transistors, such as reset transistors, source follower transistors, selector transistors, transfer transistors, other suitable transistors, or combinations thereof. Additional circuitry, input, and/or outputs may be provided to the pixel array 220 (for example, adjacent to the pixel array 220), providing an operation environment for the pixels 220R, 220G, and/or 220B and for supporting communication with the pixels 220R, 220G, and/or 220B.

A multilayer interconnect (MLI) structure 230 is disposed over the front surface 212 of the substrate 210, including over the pixel array 220. The MLI structure 230 includes dielectric layers 232, 233, and 234 having conductive layers 235 and 236 disposed therein. The dielectric layers 232, 233, and 234 may be referred to as interlayer (or inter-level) dielectric (ILD) layers or inter-metal dielectric (IMD) layers. The dielectric layers 232, 233, and 234 include a suitable dielectric material, such as silicon oxide, silicon nitride, silicon oxynitride, TEOS oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. The dielectric layers 232, 233, and 234 may include a multilayer structure comprising multiple dielectric materials. Each of the dielectric layers 232, 233, and/or 234 may include a same or different material. The dielectric layers 232, 233, and 234 are formed by a chemical vapor deposition (CVD), physical vapor deposition, (PVD), atomic layer deposition (ALD), spin-on coating, other proper process, or combinations thereof.

The conductive layers 235 and 236 include various conductive features 238 that may be configured to connect various features or structures of the BSI image sensor device 200. For example, the conductive layers 235 and 236 may be used to interconnect (for example, providing electrical interconnection) the various devices formed on the substrate 210. The conductive features 238 may be vertical interconnects, such as vias and/or contacts, and/or horizontal interconnects, such as conductive lines. The conductive layers 235 and 236 having the various conductive features 238 include a conductive material, such as as aluminum, aluminum alloy, copper, copper alloy, titanium, titanium nitride, tungsten, polysilion, metal silicide, or combinations thereof. Though the features of the conductive layers 235 and 236 are indicated by the reference numeral 238, it is understood that each of the conductive features may have a same or different material, size, dimension, or other parameter. The MLI structure 230 may be formed by any suitable process, such as a damascene or dual damascene process. Further, though three dielectric layers (232, 233, and 234) and two conductive layers (235 and 236) are disclosed in the depicted embodiment, this is for clarity and simplicity. It is thus understood that a single or multiple dielectric and conductive layer structure may be disposed over the front surface 212 of the substrate 210.

An antireflective layer 240 is disposed over the back surface 214 of the substrate 210. In the depicted embodiment, the antireflective layer 240 directly contacts the back surface 214 of the substrate 210. Alternatively, one or more layers may be disposed between the antireflective layer 240 and the back surface 214 of the substrate 210. The antireflective layer 240 is a dielectric layer, specifically a silicon carbide (SiC) layer. The SiC antireflective layer 240 has a suitable thickness, for example, a thickness of about 100 Å to about 600 Å. A composition, an index of refraction, and an extinction coefficient of the SiC antireflective layer 240 are tuned so that the BSI image sensor device 200 exhibits optimal quantum efficiency and provides optimal transmittance of various light wavelengths, such as red, green, and blue light wavelengths, to the substrate 210. For example, in the depicted embodiment, the SiC antireflective layer 240 has a Si to C ratio of about 20% to about 30%. Further, the SiC antireflective layer 240 has an index of refraction (n) greater than or equal to about 2.2 and an extinction coefficient (k) less than or equal to about 0.05 for radiation (light) wavelengths less than about 700 nm, and specifically for light wavelengths of about 400 nm to about 700 nm. In an example, the SiC antireflective layer 240 has an index of refraction greater than or equal to 2.4 for light wavelengths less than 700 nm. In an example, the extinction coefficient is 0 when the light wavelength is greater than about 550 nm and less than 0.05 when the light wavelength is about 450 nm to about 550 nm.

As noted above, the disclosed SiC antireflective layer 240 can improve quantum efficiency of image sensor devices, and in the depicted embodiment, improves quantum efficiency of the BSI image sensor device 200. More specifically, the SiC antireflective layer 240 replaces conventional silicon oxynitride (SiON) and/or silicon nitride (SiN) (for example, ultraviolet SiN (UVSN)) antireflective layers typically used in BSI image sensor devices. The SiC antireflective layer 240 is proposed because as technology nodes continue to decrease, for example, to 65 nm technology nodes and below, SiON and/or SiN antireflective layers are intrinsically limited in the quantum efficiency improvements they can provide, which will be explained in detail below.

Figure 2:
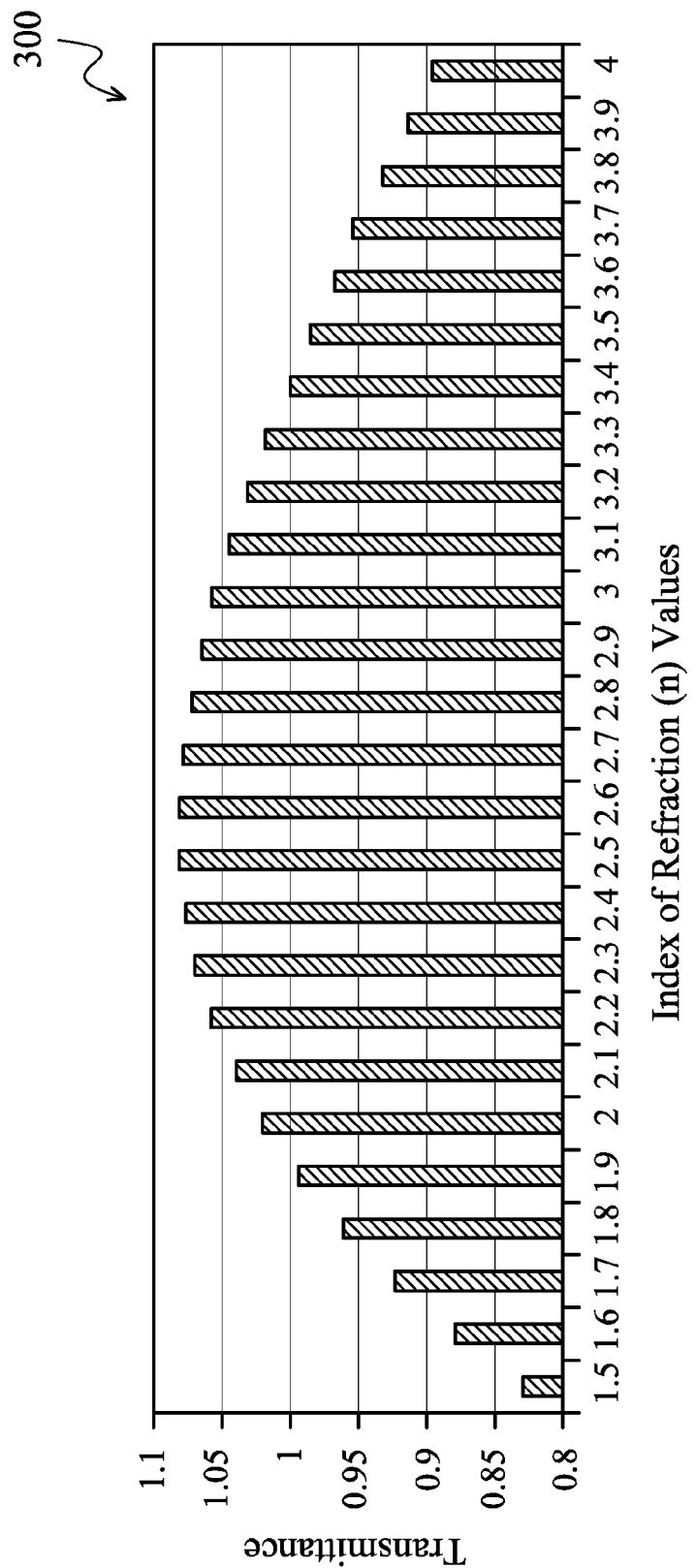
FIGS. 2-8 are graphs illustrating characteristics of various antireflective layers that can be implemented in the integrated circuit device of FIG. 1.

For purposes of this discussion, the visual light spectrum includes wavelengths from about 400 nm to about 750 nm. Blue light wavelengths are represented by wavelengths of about 440 nm to about 490 nm, green light wavelengths are represented by wavelengths of about 490 nm to about 570 nm, and red light wavelengths are represented by wavelengths of about 620 nm to about 780 nm. More specifically, for the sake of example, it is assumed that blue light is represented by a wavelength of about 450 nm, green light is represented by a wavelength of about 550 nm, and red light is represented by a wavelength of about 650 nm. Because green light wavelengths are in the center of the visual light spectrum, improving the BSI image sensor's green light transmittance will improve overall transmittance of all light wavelengths. Accordingly, in the depicted embodiment, by optimizing green light transmittance of the antireflective layer 240, the overall transmittance, and thus quantum efficiency, of the BSI image sensor device 200 is improved. For example, FIG. 2 is a graph 300 that illustrates transmittance of a green light wavelength (such as a wavelength of about 550 nm) based on an index of refraction (n) of an antireflective layer (such as antireflective layer 240) disposed over a back surface of a BSI image sensor. In FIG. 2, the horizontal axis represents index of refraction values, and the vertical axis represents the transmittance of green light wavelengths. From FIG. 2, the antireflective layer optimizes green light wavelength transmittance (from the antireflective layer to the substrate) when the index of refraction is about 2.2 to about 2.9, and specifically between about 2.4 and about 2.7. It is assumed that the extinction coefficient of the antireflective layer is about zero. Accordingly, having the antireflective layer 240 have an index of refraction greater than about 2.2 and an extinction coefficient close to zero will improve green light wavelength transmittance to the substrate 210 of the BSI image sensor device 200.

Figure 3:
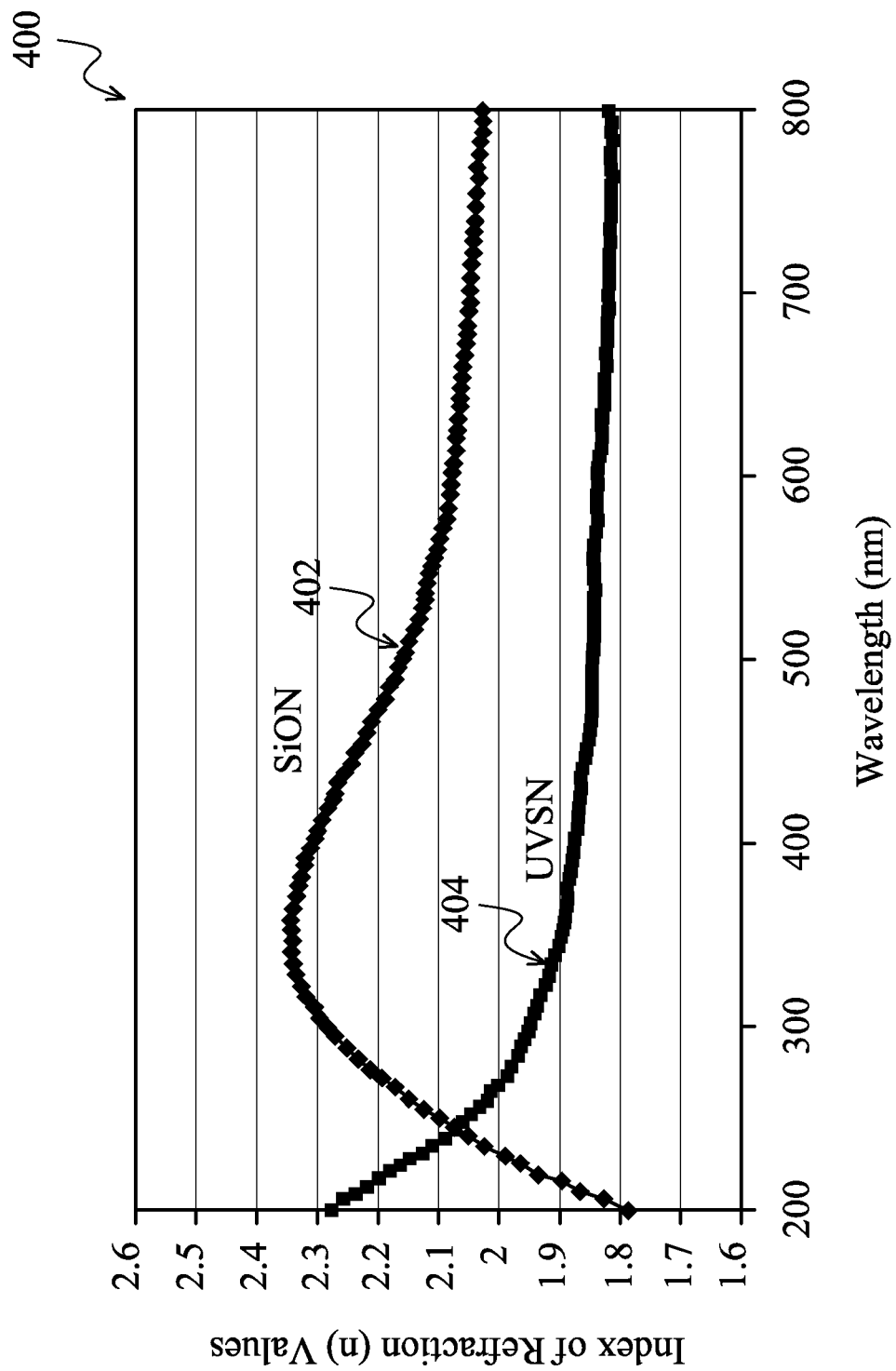
Figure 4:
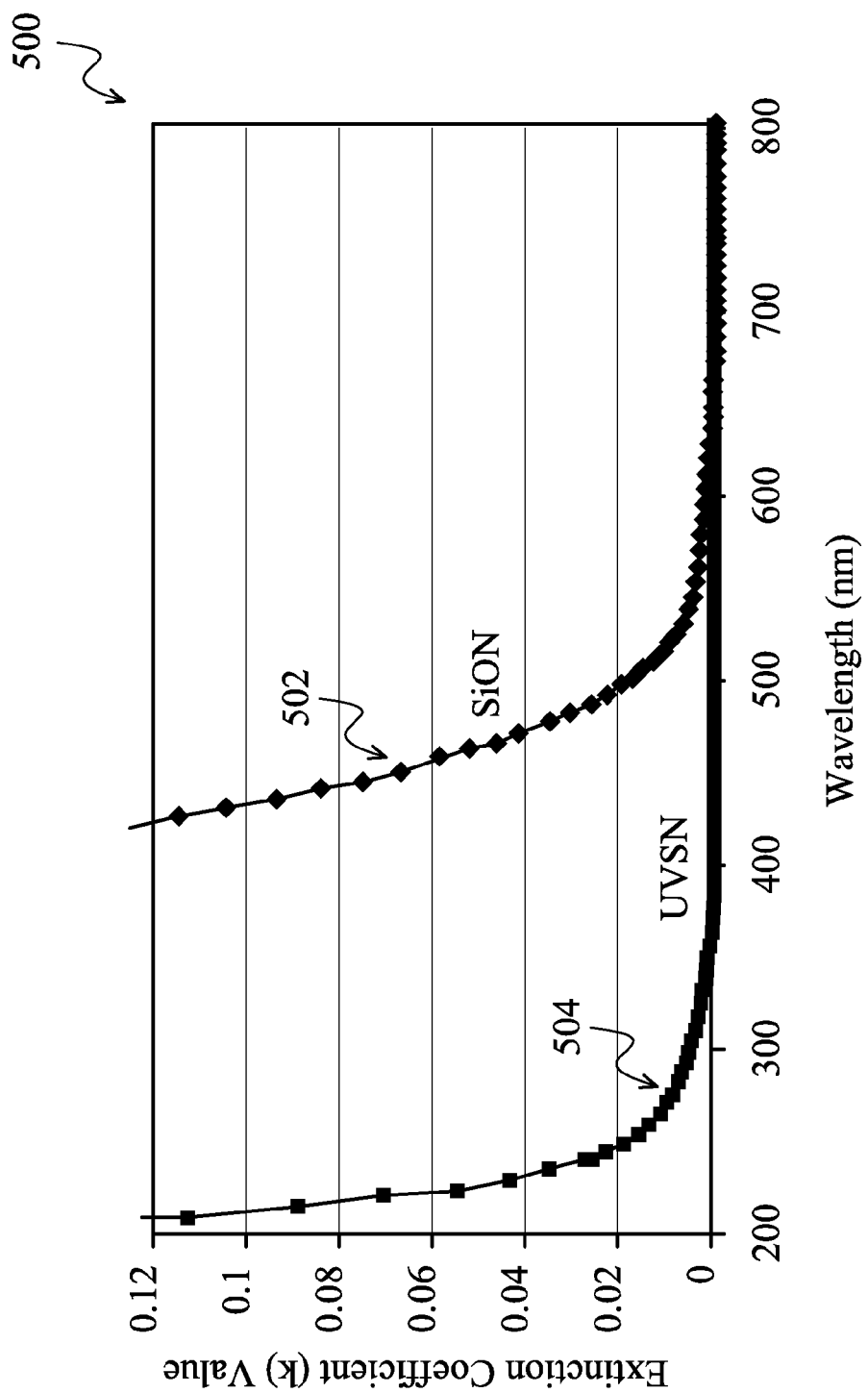

As noted above, conventional SiON and/or SiN antireflective layers are intrinsically limited in the quantum efficiency improvements they can provide. For example, FIG. 3 is a graph 400 that illustrates index of refraction values at various light wavelengths for a SiON antireflective layer and a UVSN antireflective layer used in a BSI image sensor device. In FIG. 3, the horizontal axis represents a light wavelength in nanometers (nm), and the vertical axis represents an index of refraction (n) value. Curve 402 represents the index of refraction of the SiON antireflective layer at respective measured light wavelengths, and curve 404 represents the index of refraction of the UVSN antireflective layer at respective measured light wavelengths. In FIG. 3, the highest index of refraction achieved by the SiON antireflective layer is about 2.35 at a light wavelength of about 350 nm, and the highest index of refraction achieved by the UVSN antireflective layer is about 2.3 at a light wavelength of about 200 nm. From FIG. 3, it is clear that the conventional SiON and/or UVSN antireflective layers are unable to reach index of refraction values greater than about 2.2 for optimum green light wavelength (for example, about 550 nm) transmittance. FIG. 4 is a graph 500 that illustrates extinction coefficient values at various light wavelengths for the SiON antireflective layer and UVSN antireflective layer used in the BSI image sensor device. In FIG. 4, the horizontal axis represents a light wavelength in nanometers (nm), and the vertical axis represents an extinction coefficient (k) value. Curve 502 represents the extinction coefficient of the SiON antireflective layer at respective measured light wavelengths, and curve 504 represents the extinction coefficient of the UVSN antireflective layer at respective measured light wavelengths. In FIG. 4, the extinction coefficient value for the SiON antireflective layer is greater than about 0.12 for light wavelengths less than about 400 nm, greater than about 0.02 for light wavelengths between 400 nm and 500 nm, and less than about 0.02 for light wavelengths greater than 500 nm. The extinction coefficient value for the UVSN antireflective layer is less than about 0.02 for light wavelengths of about 300 nm to about 800 nm. From FIG. 4, it is clear that the conventional SiON antireflective layer is unable to achieve an extinction coefficient of about 0 for optimum green light wavelength (for example, about 550 nm) transmittance.

Figure 5:
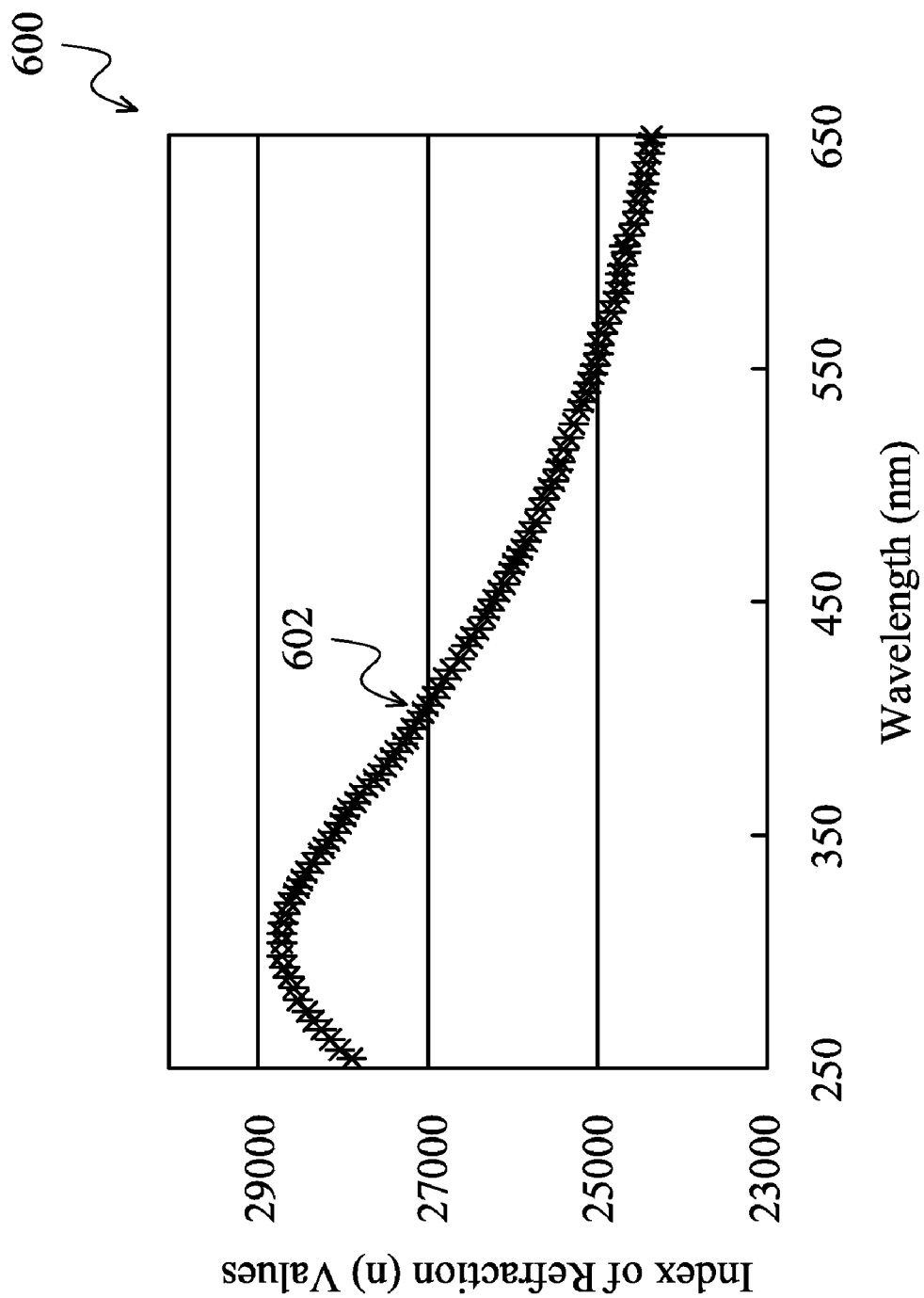
Figure 6:
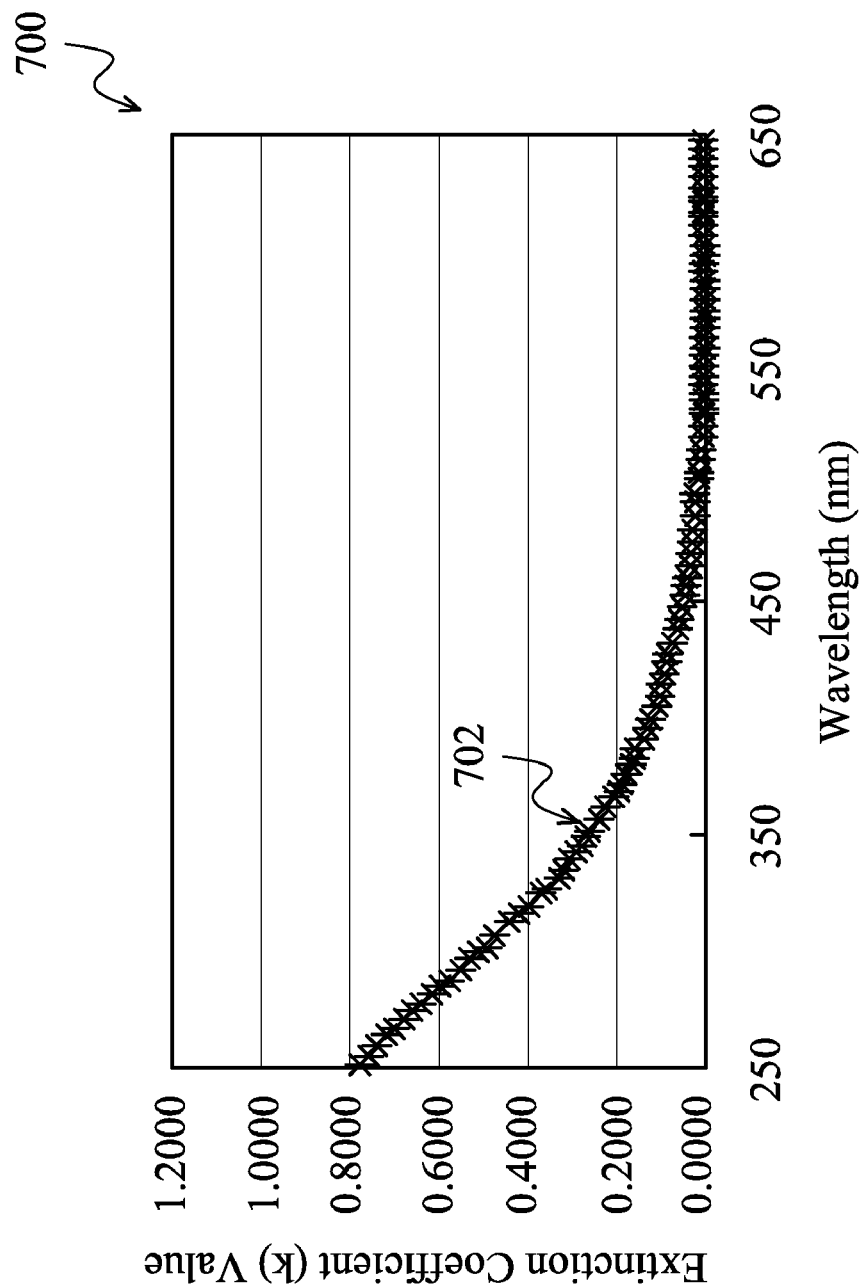

In contrast, the SiC antireflective layer, such as the SiC antireflective layer 240, can achieve both a high index of refraction and a low extinction coefficient for optimum green light wavelength transmittance. For example, FIG. 5 is a graph 600 that illustrates index of refraction values at various light wavelengths for a SiC antireflective layer, such as SiC antireflective layer 240, used in a BSI image sensor device. In FIG. 5, the horizontal axis represents a light wavelength in nanometers (nm), and the vertical axis represents an index of refraction (n) value. Curve 602 represents the index of refraction of the SiC antireflective layer at respective measured light wavelengths. In FIG. 5, the SiC antireflective layer maintains an index of refraction value above 2.3 for the entire light wavelength range, about 250 nm to about 650 nm. FIG. 6 is a graph 700 that illustrates extinction coefficient values at various light wavelengths for the SiC antireflective layer used in the BSI image sensor device. In FIG. 6, the horizontal axis represents a light wavelength in nanometers (nm), and the vertical axis represents an extinction coefficient (k) value. Curve 702 represents the extinction coefficient of the SiC antireflective layer at respective measured light wavelengths. In FIG. 6, the extinction coefficient value for the SiC antireflective layer is less than 0.8 for light wavelengths of about 250 nm to about 650 nm, and specifically is less than about 0.05 for light wavelengths of about 450 nm to about 550 nm. In fact, curve 702 also indicates that the extinction coefficient of the SiC antireflective layer is about 0 when the light wavelength is greater than about 550 nm.

Figure 7:
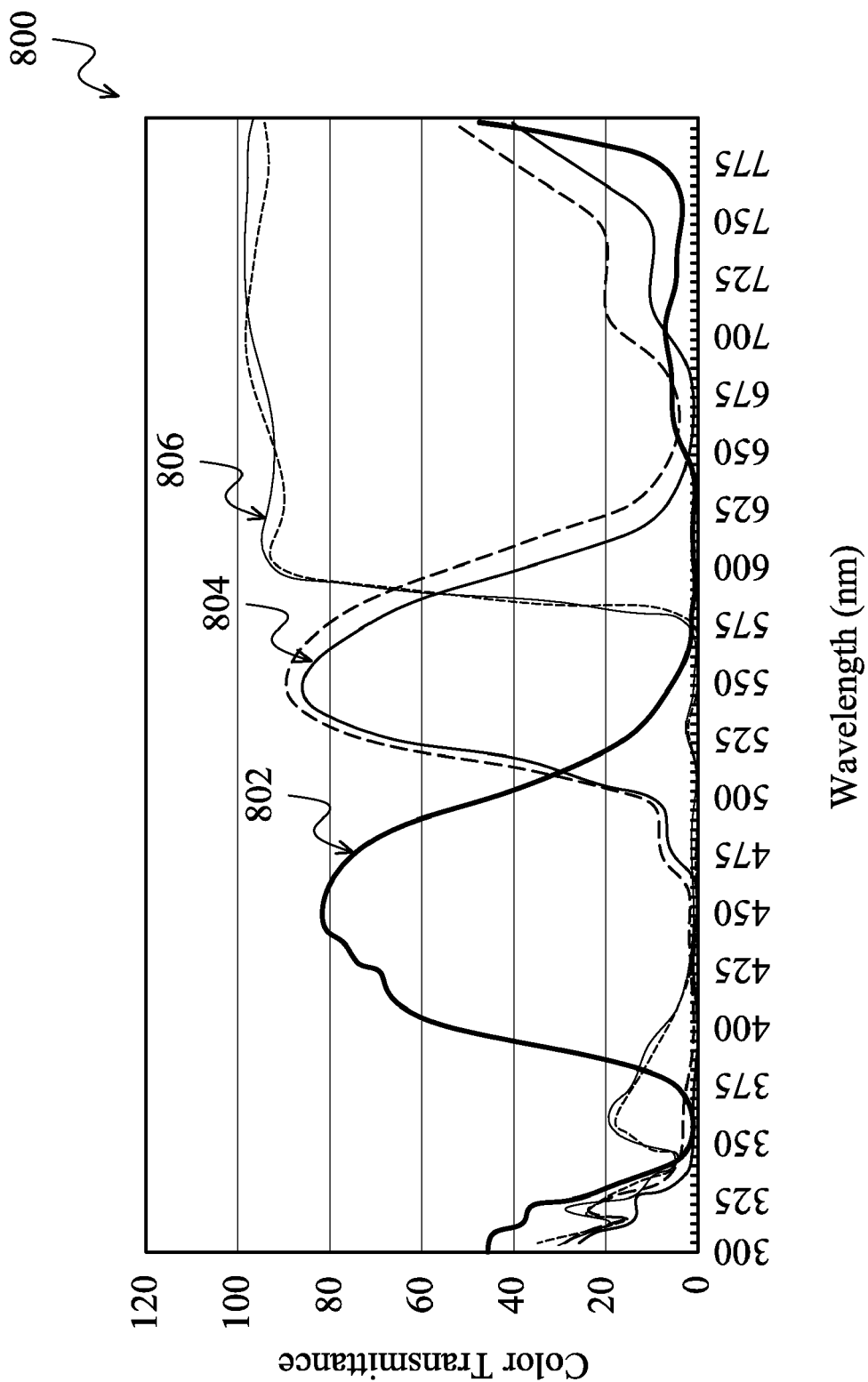
Figure 8:
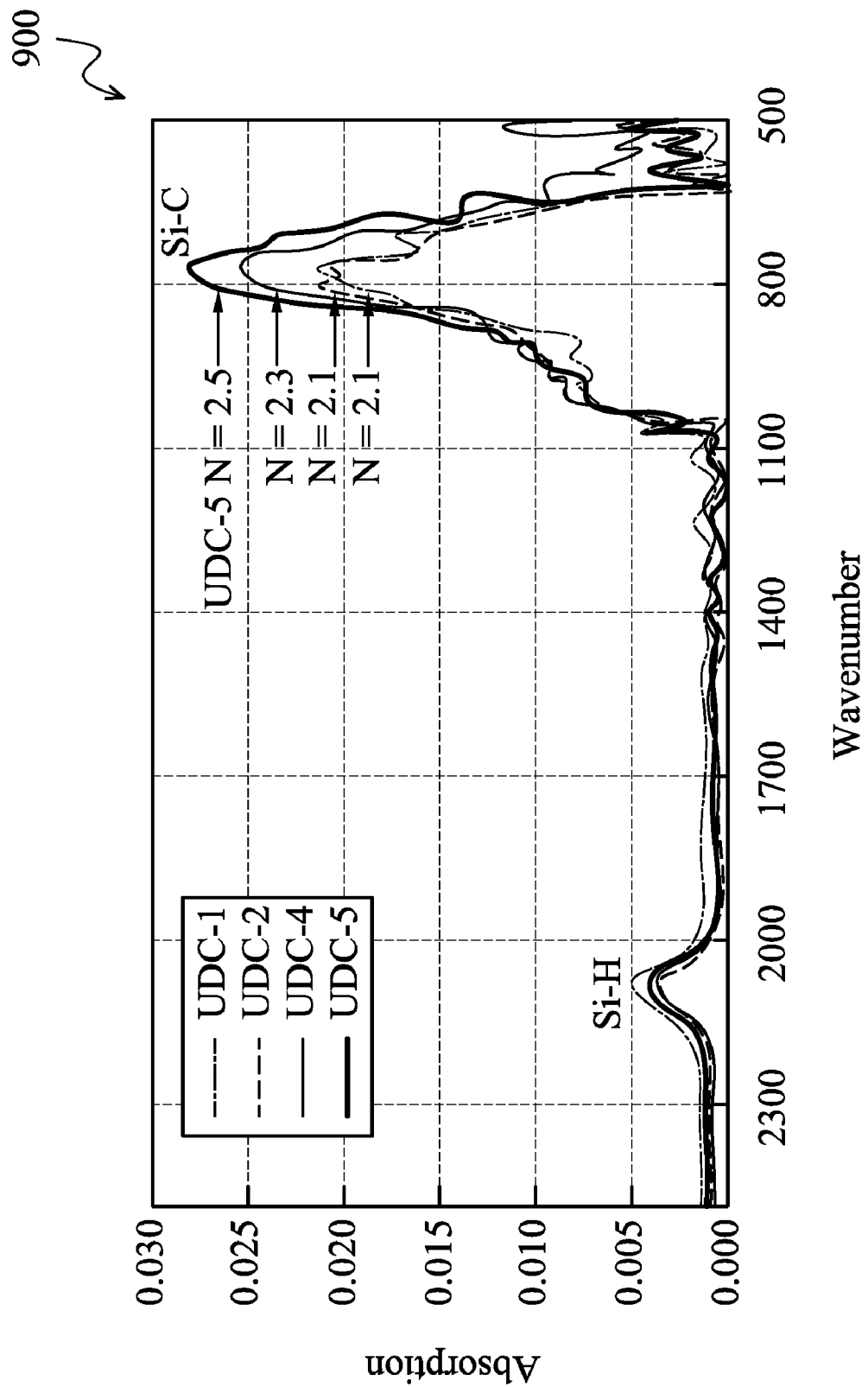

From FIGS. 5 and 6, the SiC antireflective layer, such as the SiC antireflective layer 240, can achieve an index of refraction greater than about 2.2 and an extinction coefficient of about 0, particularly at green light wavelengths, thereby providing optimal green light wavelength transmittance. FIG. 7 is a graph 800 that illustrates light wavelength transmittance of the SiC antireflective layer, such as SiC antireflective layer 240, used in the BSI image sensor device. The SiC antireflective layer has an index of refraction greater than or equal to about 2.2 and an extinction coefficient less than or equal to about 0.05 for light wavelengths less than about 700 nm, and specifically for light wavelengths of about 400 nm to about 700 nm. In FIG. 7, the horizontal axis represents a wavelength of light in nanometers (nm), and the vertical axis represents a percentage of color transmittance. Curve 802 represents transmittance of a blue light band by the SiC antireflective layer, curve 804 represents transmittance of a green light band by the SiC antireflective layer, and curve 806 represents transmittance of a red light band by the SiC antireflective layer. In FIG. 7, the disclosed SiC antireflective layer achieves blue light transmittance (for example, a light wavelength of about 450 nm) of about 80%, green light transmittance (for example, a light wavelength of about 550 nm) of about 90%, and red light transmittance (for example, a light wavelength of about 650 nm) of about 100%. FIG. 8 is a graph 900 that illustrates absorption characteristics of a SiC antireflective layer as the index of refraction of the SiC antireflective layer is varied. In FIG. 8, the horizontal axis represents a wavenumber, and the vertical axis represents absorption. Four different samples were taken, UDC-1 with an index of refraction of 2.1, UDC-2 with an index of refraction of 2.2, UDC-4 with an index of refraction of 2.3, and UDC-5 with an index of refraction of 2.5. As seen in FIG. 8, as the index of refraction of the SiC antireflective coating layer increases, the absorption increases. Accordingly, from the foregoing description, it is clear that the disclosed SiC antireflective layer 240 can thus achieve improved light transmittance for all light wavelengths, leading to improved quantum efficiency and reduced signal to noise ratio of the BSI image sensor device 200.

Figure 9:
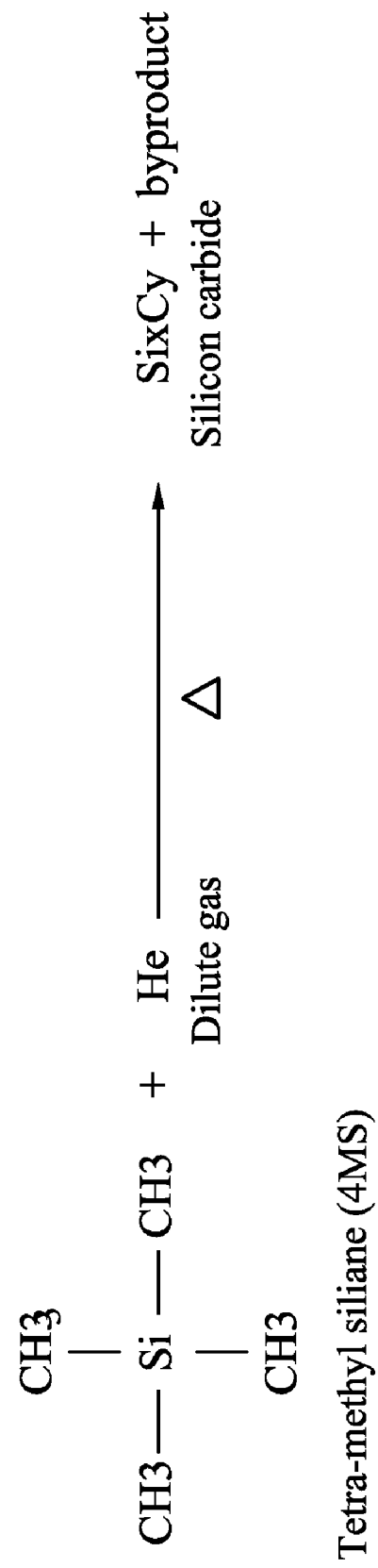
FIG. 9 illustrates a chemical reaction between gases that can be used to form an antireflective layer that can be implemented in the integrated circuit device of FIG. 1.

The composition, index of refraction, and extinction coefficient of the antireflective layer 240 can be tuned (modified) by controlling various process parameters in the antireflective layer's formation process. For example, in the depicted embodiment, the SiC antireflective layer 240 is formed by a chemical vapor deposition (CVD) process, such as a plasma enhanced CVD (PECVD) process. Various process parameters of the PECVD process are modified to tune the SiC antireflective layer 240 to have the desired composition, index of refraction, and extinction coefficient described herein. Examples of the various process parameters that can be tuned include types of gas, gas flow rates, power (such as a radiofrequency (RF) power), chamber pressure, chamber temperature, wafer temperature, other process parameters, or combinations thereof. In the depicted embodiment, the SiC antireflective layer 240 is formed in a process chamber of a PECVD tool, such as a Novellus VECTOR® PECVD tool having multiple chambers or Applied Materials Applied Producer SE PECVD tool having a twin chamber. For example, the PECVD process chamber may include one or more material inlets (for a liquid and/or gas source) with valves for controlling a flow rate of materials provided to the chamber during the PECVD process. The materials and their corresponding flow rates can be used to control the composition and thickness of the SiC antireflective coating layer 240 being deposited over the back surface 214 of the substrate 210. For example, in the depicted embodiment, the PECVD process uses a helium (He) gas and a tetramethylsilane (4MS) gas to form the SiC antireflective layer 240. FIG. 9 illustrates a chemical reaction between 4MS and He to form the SiC material. In an example, the PECVD process uses a 4MS flow rate of about 300 sccm to about 500 sccm, and an He flow rate of about 4,000 sccm to about 8,000 sccm. In an example, the PECVD process uses a chamber pressure (such as a RF power) of about 2 Torr to about 3 Torr, a chamber temperature of about 300° C. to about 350° C., and a power of about 800 W to about 1,300 W. Tuning the various process parameters can also achieve the ratio of Si to C of about 20% to about 30%. It is understood that another process, other than the PECVD process, could be implemented to form the tuned SiC antireflective layer 240.

To achieve the desired composition, index of refraction, and extinction coefficients described herein, forming the SiC antireflective layer 240 can focus on tuning the antireflective layer 240 to have (1) no Si—O or Si—N bonds, (2) increased Si—C bonds, and/or (3) increased network carbon. In the depicted embodiment, the SiC antireflective layer 240 is tuned to be free of Si—O and/or Si—N bonds, which typically lead to lower than desirable indexes of refraction and higher than desirable extinction coefficients (for example, as in the conventional SiON and/or UVSN antireflective layers that include Si—O and Si—N bonds, which prevent these conventional antireflective coating layers from achieving the higher indexes of refraction with low extinction coefficients). Further, in the depicted embodiment, the SiC antireflective layer 240 is tuned to achieve increased Si—C bonds. This can be achieved by varying the gas ratio to achieve the ratio of Si to C of about 20% to about 30%. The increased Si—C bonds contribute to a higher index of refraction combined with a low extinction coefficient of the SiC antireflective layer 240. Accordingly, other Si to C ratios are contemplated, so long as the high index of refraction/low extinction coefficient is achieved. Increasing the Si—C bonds can also increase the amount of networked C, meaning that the C is fully bonded to Si or other constituents of the composition of the SiC antireflective layer 240. In an example, the SiC antireflective layer 240 is tuned to be free of dangling C chains. Increasing the amount of networked C can be achieved by lowering the deposition rate.

Referring again to FIG. 1, a color filter layer 250 overlies the back surface 214 of the substrate 210. More specifically, the color filter layer 250 overlies the antireflective coating layer 240 of the BSI image sensor device 200. In the depicted embodiment, the color filter layer 250 supports more than one color filter. For example, the color filter layer 250 includes a color filter 250R for filtering through visible light of a red wavelength to the pixel 220R, a color filter 250G for filtering through visible light of a green wavelength to the pixel 220G, and a color filter 250B for filtering through visible light of a blue wavelength to the pixel 220B. Each of the color filters 250R, 250G, and 250B is aligned with its respective, corresponding pixel 220R, 220G, and 220B. The color filters 250R, 250G, and 250B include any suitable material. For example, the color filters 250R, 250G, and 250B may include a dye-based (or pigment-based) polymer for filtering out a specific frequency band (for example, a desired wavelength of light). Alternatively, the color filters 250R, 250G, and 250B could include a resin or other organic-based material having color pigments.

A microlens layer 260 is disposed over the color filter layer 250. In the depicted embodiment, the microlens layer 260 includes a mircolens aligned with each color filter 250R, 250G, and 250B, and thus, aligned with each pixel 220R, 220G, and 220B. The microlenses may be in various positional arrangements with the pixel array 220 and color filters 250 to focus the incident radiation 225 on the light sensing regions of the substrate 210. Each microlens includes a suitable material, and the mircolenses in the microlens layer 260 may have a same or different materials. Further, the mircolenses may have a variety of shapes and sizes depending on an index of refraction of the material used for the microlenses and/or a distance between the microlenses and light sensing regions of the substrate 210. Alternatively, the position of the color filter layer 250 and microlens layer 260 may be reversed, such that the microlens layer 260 is disposed between the antireflective layer 240 and color filter layer 250. The present disclosure also contemplates the BSI image sensor device 200 having a color filter layer disposed between microlens layers. The microlens layer above the color filter layer may have a same or different material and/or refractive index as the microlens layer below the color filter layer.

In operation, the BSI image sensor device 200 is designed to receive radiation 225 traveling towards the back surface 214 of the substrate 210. The microlens layer 260 directs the incident radiation 225 to the color filters 250R, 250G, and 250B. The light then passes from the color filters 250R, 250G, and 250B through the SiC antireflective layer 240 to the substrate 210 and corresponding pixels 220R, 220G, and 220B (specifically the light sensing regions 222R, 222G, and 222B). Light passing through to the color filters 250R, 250G, and 250B and pixels 220R, 220G, and 220B may be maximized since the light is not obstructed by various device features (for example, gates electrodes) and/or metal features (for example, the conductive layers 235 and 236 of the MLI structure 230) overlying the front surface 212 of the substrate 210. The desired wavelength of light (for example, red, green, and blue light) that is allowed to pass through to the respective pixels 220R, 220G, and 220B induces a photocurrent, which may be recorded and processed. The SiC antireflective layer 240 of the BSI image sensor device 200 provides increased transmittance of light wavelengths, specifically red, green, and blue, to the substrate 210, and thus to the light-sensing regions 222R, 222G, and 222B of the pixels 220R, 220G, and 220B, respectively.

The present disclosure thus provides an antireflective layer for image sensor devices that can provide increased transmittance of light wavelengths, specifically red, green, and blue. Accordingly, image sensor devices with improved quantum efficiency are achieved. For example, it has been observed that the disclosed SiC antireflective layer can improve quantum efficiency of BSI image sensor devices by as much as 10%. The disclosed SiC antireflective layer has also been observed to significantly reduce signal to noise ratio. The disclosed composition, index of refraction, and/or extinction coefficient contribute to the improved transmittance. Further, it should be noted that the disclosed antireflective layer can be achieved in devices as technology nodes continually scale down, for example, from 65 nm technology nodes and below. Different embodiments may have different advantages than those described herein, and no particular advantage is necessarily required of any embodiment.

The present disclosure provides for many different embodiments. In an example, a backside illuminated (BSI) image sensor device includes a substrate having a front surface and a back surface; a light sensing region disposed at the front surface of the substrate; and an antireflective layer disposed over the back surface of the substrate. The antireflective layer has an index of refraction greater than or equal to about 2.2 and an extinction coefficient less than or equal to about 0.05 when measured at a wavelength less than 700 nm. The antireflective layer may have a thickness of about 100 Å to about 600 Å. The antireflective layer may be free of Si—O and Si—N bonds. In an example, the antireflective layer is a silicon carbide (SiC) layer. A ratio of Si to C of the SiC layer may be about 20% to about 30%. The BSI image sensor device may further include a color filter disposed over the antireflective layer, and a microlens disposed over the color filter. The color filter and microlens may be aligned with the light sensing region.

In another example, a backside illuminated (BSI) image sensor device includes a substrate having a front surface and a back surface; a light sensing region disposed at the front surface of the substrate; and a silicon carbide (SiC) antireflective layer disposed over the back surface of the substrate, wherein the SiC antireflective layer has a ratio of Si to C of about 20% to about 30%. The SiC antireflective layer may have an index of refraction greater than or equal to about 2.4 for light wavelengths of about 450 nm to about 700 nm. The SiC antireflective layer may have a thickness of about 100 Å to about 600 Å. The SiC antireflective layer may be free of Si—O and Si—N bonds. In an example, the SiC antireflective layer provides a relatively high level of transmission for radiation wavelengths of about 450 nm to about 550 nm, as compared to a silicon oxynitride (SiON) or silicon nitride (SiN) antireflective layer. The SiC antireflective layer may have an extinction coefficient less than or equal to about 0.05. In an example, the substrate is a silicon substrate, and the SiC antireflective layer may directly contact the silicon substrate.

In yet another example, a method includes providing a substrate having a front surface and a back surface; forming a light sensing region at the front surface of the substrate; and forming an antireflective layer over the back surface of the substrate. The antireflective layer is tuned to have an index of refraction greater than or equal to about 2.2 and an extinction coefficient less than or equal to about 0.05 when measured at a wavelength less than 700 nm. In an example, forming the antireflective layer includes forming a SiC antireflective layer using a plasma enhanced chemical vapor deposition (PECVD) process. The PECVD process may use a gas mixture including helium (He) and tetramethylsilane (4MS). The PECVD process may use a 4MS flow rate of about 300 sccm to about 500 sccm and an He flow rate of about 4,000 sccm to about 8,000 sccm. The PECVD process may use a chamber pressure of about 2 Torr to about 3 Torr, a chamber temperature of about 300° C. to about 350° C., and a power of about 800 W to about 1,300 W. Forming the SiC antireflective layer may include tuning the PECVD process to form the SiC antireflective layer with a Si to C ratio of about 20% to about 30%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A backside illuminated (BSI) image sensor device comprising:
   a substrate having a front surface and a back surface;
   a light sensing region disposed at the front surface of the substrate; and
   an antireflective layer disposed over the back surface of the substrate, wherein the antireflective layer has an index of refraction greater than or equal to about 2.2 and an extinction coefficient less than or equal to about 0.05 when measured at a wavelength of about 490 nm to about 570 nm.

2. The BSI image sensor device of claim 1 wherein the extinction coefficient is 0 when measured at a wavelength greater than 550 nm.

3. The BSI image sensor device of claim 1 wherein the index of refraction is greater than or equal to about 2.4.

4. The BSI image sensor device of claim 1 wherein the antireflective layer is a silicon carbide (SiC) layer.

5. The BSI image sensor device of claim 4 wherein the SiC layer has a ratio of Si to C of about 20% to about 30%.

6. The BSI image sensor device of claim 1 wherein the antireflective layer is free of Si—O and Si—N bonds.

7. The BSI image sensor device of claim 1 wherein the antireflective layer has a thickness of about 100 Å to about 600 Å.

8. A backside illuminated (BSI) image sensor device comprising:
a substrate having a front surface and a back surface;
a light sensing region disposed at the front surface of the substrate; and
a silicon carbide (SiC) antireflective layer disposed over the back surface of the substrate, wherein the SiC antireflective layer has a ratio of Si to C of about 20% to about 30%.

9. The BSI image sensor device of claim 8 wherein the SiC antireflective layer has an index of refraction greater than or equal to about 2.4 for light wavelengths of about 450 nm to about 700 nm.

10. The BSI image sensor device of claim 8 wherein the SiC antireflective layer is free of Si—O and Si—N bonds.

11. The BSI image sensor device of claim 8 wherein the SiC antireflective layer provides a high level of transmission for radiation wavelengths of about 450 nm to about 550 nm, as compared to a silicon oxynitride (SiON) or silicon nitride (SiN) antireflective layer.

12. The BSI image sensor device of claim 8 wherein the SiC antireflective layer has an extinction coefficient less than or equal to about 0.05.

13. The BSI image sensor device of claim 8 wherein the SiC antireflective layer directly contacts the substrate.

14. The BSI image sensor device of claim 8 wherein the SiC antireflective layer has a thickness of about 100 Å to about 600 Å.

15. A method comprising:
providing a substrate having a front surface and a back surface;
forming a light sensing region at the front surface of the substrate; and
forming an antireflective layer over the back surface of the substrate, wherein the antireflective layer is tuned to have a Si to C ratio of about 20% to about 30%.

16. The method of claim 15 wherein the forming the antireflective layer includes using a plasma enhanced chemical vapor deposition (PECVD) process.

17. The method of claim 16 wherein the performing the PECVD process includes using a gas mixture including helium (He) and tetramethylsilane (4MS).

18. The method of claim 17 wherein the performing the PECVD process includes using a 4MS flow rate of about 300 sccm to about 500 sccm and an He flow rate of about 4,000 sccm to about 8,000 sccm.

19. The method of claim 16 wherein the performing the PECVD process includes using a chamber pressure of about 2 Torr to about 3 Torr, a chamber temperature of about 300° C. to about 350° C., and a power of about 800 W to about 1,300 W.

20. The method of claim 16 wherein the forming the antireflective layer includes tuning the PECVD process to achieve an index of refraction greater than or equal to about 2.2 and an extinction coefficient less than or equal to about 0.05 when measured at a wavelength less than 700 nm.

\* \* \* \* \*